United States Patent
Sharma et al.

(10) Patent No.: US 6,894,918 B2
(45) Date of Patent: May 17, 2005

(54) SHARED VOLATILE AND NON-VOLATILE MEMORY

(75) Inventors: Manish Sharma, Mountain View, CA (US); Frederick Perner, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/697,367

(22) Filed: Oct. 30, 2003

(65) Prior Publication Data

US 2004/0202022 A1 Oct. 14, 2004

Related U.S. Application Data

(62) Division of application No. 10/195,818, filed on Jul. 15, 2002.

(51) Int. Cl.[7] ............................................. G11C 11/25
(52) U.S. Cl. ................... 365/149; 365/158; 365/189.04
(58) Field of Search ....................... 365/185.09, 189.04, 365/149, 158

(56) References Cited

U.S. PATENT DOCUMENTS

| | | | |
|---|---|---|---|
| 5,250,827 A | | 10/1993 | Inque et al. |
| 5,640,343 A | | 6/1997 | Gallagher et al. |
| 5,732,408 A | * | 3/1998 | Takahashi .................. 711/113 |
| 5,956,749 A | * | 9/1999 | Kakihara .................... 711/162 |
| 6,285,575 B1 | | 9/2001 | Miwa |
| 6,285,586 B1 | | 9/2001 | Chen et al. |
| 6,401,163 B1 | * | 6/2002 | Kondo et al. ............... 711/100 |
| 6,622,243 B1 | * | 9/2003 | Christeson .................... 713/1 |
| 6,798,334 B1 | * | 9/2004 | Meister et al. ............. 340/5.52 |
| 2002/0087886 A1 | * | 7/2002 | Ellis ........................... 713/201 |

FOREIGN PATENT DOCUMENTS

| | | |
|---|---|---|
| EP | 0299633 | 1/1989 |
| JP | 11251534 | 9/1999 |
| JP | 2001113355 | * 4/2004 |

* cited by examiner

*Primary Examiner*—Hoai Ho

(57) ABSTRACT

The invention includes an apparatus and a method that provides a memory back-up system. The memory back-up system includes a first memory cell, and a non-volatile memory cell that is interfaced to the first memory cell. Control circuitry allows data to be written to either the first memory cell or the non-volatile memory cell, and provides transfer of the data from either the first memory cell or the non-volatile memory cell, to the other of either the first memory cell or the non-volatile memory cell. The memory back-up system can also include a plurality of first memory cells, and a plurality of non-volatile memory cells that are interfaced to the first memory cells. Control circuitry allows data to be written to either the first memory cells or the non-volatile memory cells, and that provides transfer of the data from either the first memory cells or the non-volatile memory cells, to the other of either the first memory cells or the non-volatile memory cells.

12 Claims, 11 Drawing Sheets

SHARED VOLATILE AND NON-VOLATILE MEMORY

This application is a division of Ser. No. 10/195,818 filed Jul. 15, 2002.

1. Field of the Invention

The invention relates generally to electronic memory. More particularly, the invention relates to shared volatile and non-volatile memory.

2. Background of the Invention

Electronic memory devices include both volatile and non-volatile memory. Volatile memory is memory that loses its content (data) when power connected to the memory is turned off. Presently, most random access memory (RAM) is volatile. Non-volatile memory is memory that retains its content (data) even when power connected to the memory is turned off. Read only memory (ROM), for example, is generally non-volatile memory.

Dynamic random access memory (DRAM) is a type of volatile memory. DRAM is the most common RAM used in personal computers and workstations. DRAM is dynamic, and unlike static RAM (SRAM), DRAM needs to have its storage cells refreshed or provided with a new electronic charge every few milliseconds. DRAM generally stores each bit in a storage cell consisting of a capacitor and a transistor. Capacitors tend to lose their charge rather quickly, therefore requiring recharging.

FIG. 1 shows a DRAM cell 100. The DRAM cell 100 includes a charging capacitor CD, and a transistor QD. A logical state, or bit, is stored by the DRAM cell 100 by storing a charge on the charging capacitor CD. The charge on the capacitor CD can be sensed by selecting the DRAM cell 100 through a word line WL, and sensing the voltage across the capacitor CD through a bit line BL. Generally, sensing the voltage across the capacitor CD discharges the capacitor CD, requiring the capacitor CD to be recharged.

Magnetic random access memory (MRAM) is a type of non-volatile memory. MRAM includes storing a logical state, or bit, by setting magnetic field orientations of an MRAM cell. The magnetic field orientations remain even when power to the MRAM cell is turned off.

FIG. 2 shows an MRAM cell 200. The MRAM memory cell 200 includes a soft magnetic region 220, a dielectric region 230 and a hard magnetic region 210. The orientation of magnetization within the soft magnetic region 220 is non-fixed, and can assume two stable orientations as shown by the arrow M1. The hard magnetic region 210 (also referred to as a pinned magnetic region) has a fixed magnetic orientation as depicted by the arrow M2. The dielectric region 230 generally provides electrical insulation between the soft magnetic region 220 and the hard magnetic region 210.

As previously stated, the orientation of magnetization of the soft magnetic region 220 can assume two stable orientations. These two orientations, which are either parallel or anti-parallel to the magnetic orientation of the hard magnetic region 210, determine the logical state of the MRAM memory cell 200.

The magnetic orientations of the MRAM memory cells are set (written to) by controlling electrical currents flowing through the word lines and the bit lines, and therefore, by the corresponding magnetic fields induced by the electrical currents. Because the word line and the bit line operate in combination to switch the orientation of magnetization of the selected memory cell (that is, to write to the memory cell), the word line and the bit line can be collectively referred to as write lines. Additionally, the write lines can also be used to read the logic value stored in the memory cells.

The orientation of magnetization of the soft magnetic region 220 is determined in response to electrical currents applied to the bit lines (BL) and the word lines (WL) during a write operation to the MRAM memory cell. The electrical currents applied to the bit line and the word line set the orientation of the magnetization of the soft magnetic layer depending upon the directions of the currents flowing through the bit line and the word line, and therefore, the directions of the induced magnetic fields created by the currents flowing through the bit line and the word line.

The MRAM memory cells are read by sensing a resistance across the MRAM memory cells. The resistance is sensed through the word lines and the bit lines.

Reading and writing to MRAM memory cells can take longer than reading and writing to DRAM cells. However, MRAM memory cells offer the advantage of being non-volatile.

Some of the advantages offered by MRAM and DRAM can be realized by physically placing an MRAM integrated circuit that includes an array of MRAM cells proximate to a DRAM integrated circuit that includes an array of DRAM cells. The MRAM, for example, could be used to back up the DRAM. This configuration can be advantageous if a power supply to the DRAM is turned off. This configuration, however, is problematic because physical limitations require the DRAM and MRAM integrated circuits to have a relatively small number of input/output lines. Therefore, backing up an entire array of DRAM cells can be time consuming and complicated because generally the number of input/output lines that access the array of DRAM memory cells is much smaller than the number of memory cells within the array of DRAM memory cells.

It is desirable to have a memory system that includes the benefits of both volatile and non-volatile memory. It is desirable that the memory system should allow for efficient transfer of large amounts of data between the volatile and non-volatile memory.

SUMMARY OF THE INVENTION

The invention includes an apparatus and a method for providing a memory system that includes the benefits of both volatile and non-volatile memory. The memory system allows for efficient transfer of large amounts of data between the volatile and non-volatile memory.

A first embodiment of the invention includes a memory back-up system. The memory back-up system includes a first memory cell, and a non-volatile memory cell that is interfaced to the first memory cell. Control circuitry allows data to be written to either the first memory cell or the non-volatile memory cell, and provides transfer of the data from either the first memory cell or the non-volatile memory cell, to the other of either the first memory cell or the non-volatile memory cell.

Another embodiment of the invention includes memory back-up system. The memory back-up system includes a plurality of first memory cells, and a plurality of non-volatile memory cells that are interfaced to the first memory cells. Control circuitry allows data to be written to either the first memory cells or the non-volatile memory cells, and that provides transfer of the data from either the first memory cells or the non-volatile memory cells, to the other of either the first memory cells or the non-volatile memory cells.

Other aspects and advantages of the present invention will become apparent from the following detailed description, taken in conjunction with the accompanying drawings, illustrating by way of example the principles of the invention.

DETAILED DESCRIPTION

Figure 1:
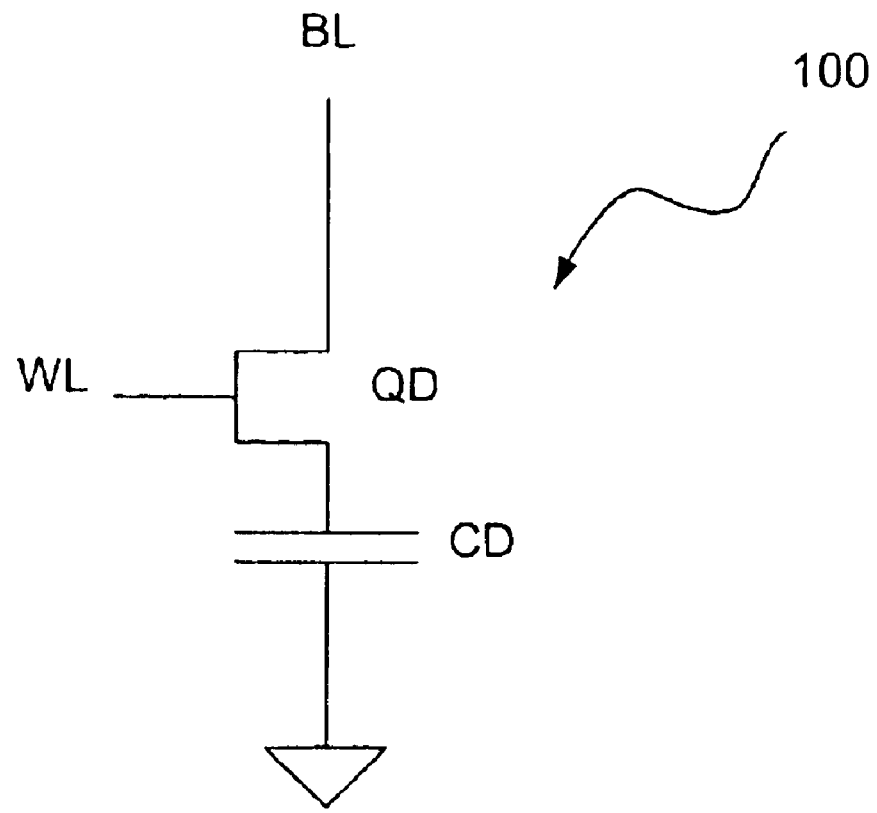
FIG. 1 shows a prior art DRAM memory cell.
Figure 2:
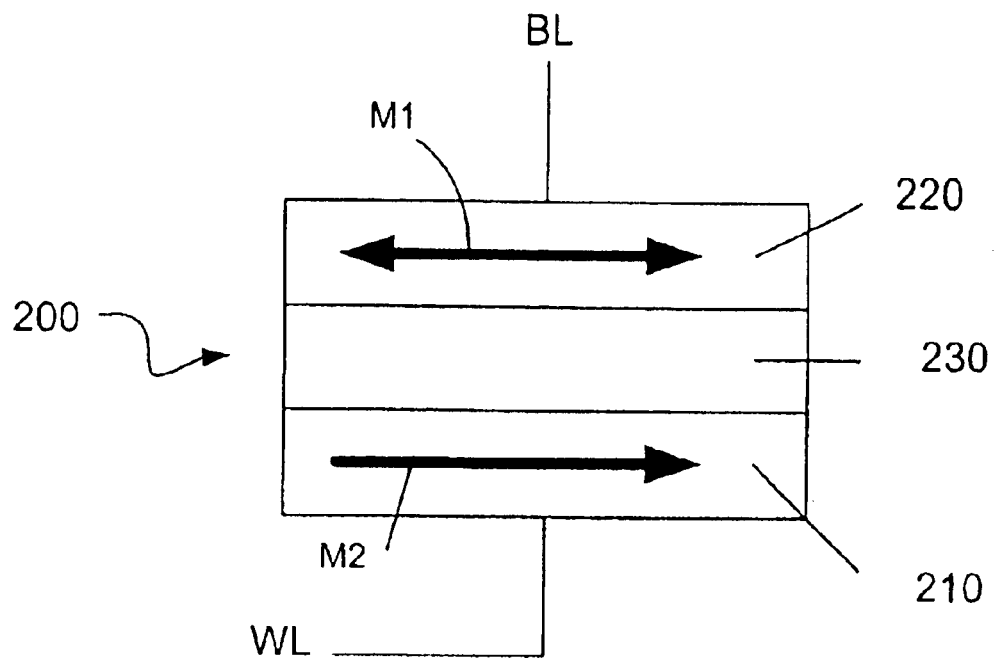
FIG. 2 shows a prior art MRAM memory cell.

As shown in the drawings for purposes of illustration, the invention is embodied in an apparatus and a method for integrating volatile and non-volatile memory. The memory system allows for efficient transfer of large amounts of data between the volatile and non-volatile memory.

Figure 3:
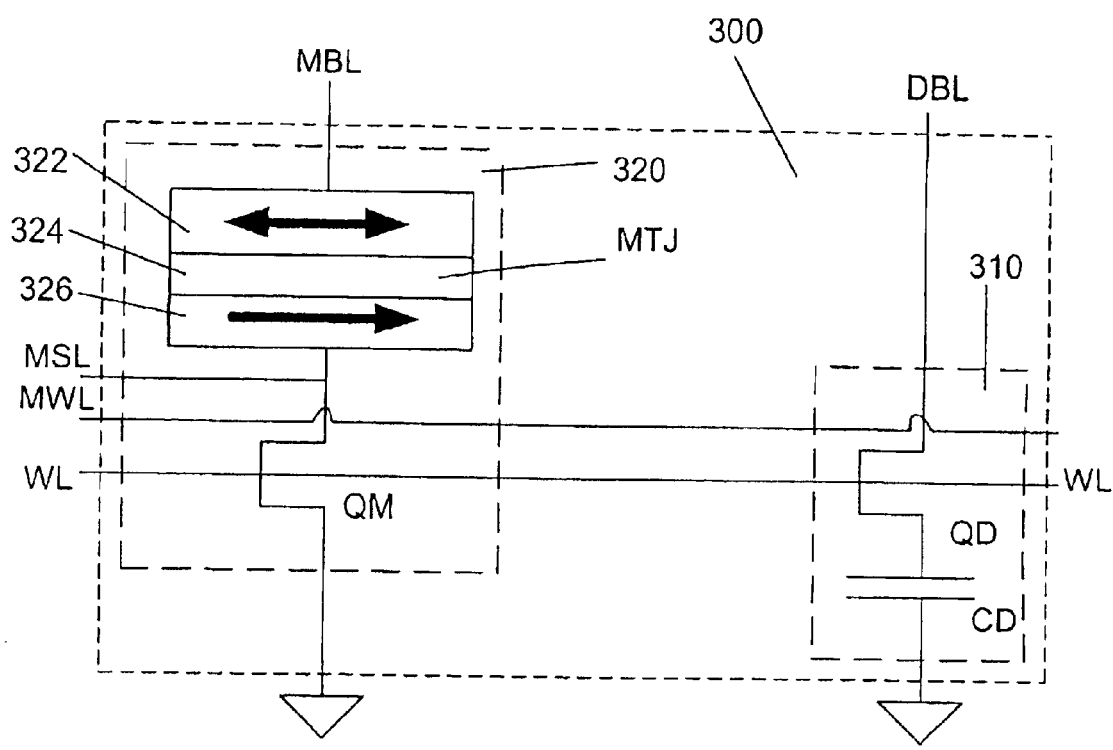
FIG. 3 shows a shared memory cell according to an embodiment of the invention.

FIG. 3 shows an embodiment of the invention. This embodiment includes a shared DRAM/MRAM memory cell 300 that includes a first memory cell 310, and a non-volatile memory cell 320 that is interfaced to the first memory cell 310.

The first memory cell 310 can include a DRAM memory cell. The DRAM memory cell shown in FIG. 3 includes a DRAM controlling transistor QD and a charging capacitor CD. Charge is both stored on the charging capacitor CD, and sensed from the charging capacitor CD through a word line WL and a bit line DBL.

The non-volatile memory cell 320 can include an MRAM memory cell. The MRAM memory cell shown in FIG. 3 includes an MRAM controlling transistor QM and a magnetoresistive tunnel junction (MTJ) memory cell. Magnetic states of the MRAM memory cell 320 are set by magnetic fields generated by current flowing through bit line MBL and write word line MWL. The magnetic state of the MRAM cell 320 is sensed, by sensing a resistance of the MTJ memory cell through a sense line MSL and a bit line MBL. As previously described, the magnetic orientation of the MTJ memory cell determines the resistance across the MTJ memory cell.

The MTJ memory cell includes a reference (pinned) layer 326 that includes a preset magnetic orientation. The MTJ memory cell further includes a sense layer 322, and an insulating tunnel barrier 324 that separates the reference layer 326 and the sense layer 322.

The reference layer 326 and the sense layer 322 can be made of a ferromagnetic material.

If the magnetization of the sense layer 322 and the reference layer 326 of the MTJ memory cell are in the same direction, the orientation of the MTJ memory cell can be referred to as being "parallel." If the magnetization of the sense layer 322 and the reference layer 326 of the MTJ memory cell are in opposite directions, the orientation of the MTJ memory cell can be referred to as being "anti-parallel." The two orientations, parallel and anti-parallel, can correspond to MTJ memory cell states of low or high resistance respectively.

The insulating tunnel barriers 324 allow quantum mechanical tunneling to occur between the reference layer 326 and the sense layer 322. The tunneling is electron spin dependent, causing the resistance of the MTJ memory cell to be a function of the relative orientations of the magnetization directions of the reference layer 326 and the sense layer 322. The resistance state of the MJT memory cell can be sensed to determine the magnetization orientations of the reference layer 326 and the sense layer 322.

The resistance of the MTJ memory cell is a first value (R) if the magnetization orientation of the MTJ memory cell is parallel and a second value (R+delta) if the magnetization orientation is anti-parallel. The invention, however, is not limited to the magnetization orientation of the two layers, or to just two layers.

The insulating tunnel barrier 324 can be made of aluminum oxide, silicon dioxide, tantalum oxide, silicon nitride, aluminum nitride, or magnesium oxide. However, other dielectrics and certain semiconductor materials may also be used for the insulating tunnel barrier 324. The thickness of the insulating tunnel barrier 324 may range from about 0.5 nanometers to about three nanometers. However, the invention is not limited to this range.

The sense layer 322 may be made of a ferromagnetic material. The reference layer 326 can be implemented as a synthetic ferrimagnet (SF), also referred to as an artificial antiferromagnet.

The non-volatile memory cell can include other types of memory including ferro-electric FeRAM and Flash memory. These other non-volatile types of memory are well known in the art of digital electronics.

The MRAM/DRAM memory cell 300 structure of FIG. 3 allows both the first memory cell 310 and the non-volatile memory cell 320 to be written to and read from at the same time. A single word line WL is connected to both the first memory cell 310 and the non-volatile memory cell 320.

The shared MRAM/DRAM memory cell 300 provides for the integration of MRAM and DRAM memory cells on a common substrate. As will be shown later, the integrated memory cell allows for the formation of integrated memory cell arrays in which large amounts of data can be easily transferred from MRAM cells to DRAM cells, and/or from DRAM cells to MRAM cells.

Figure 4:
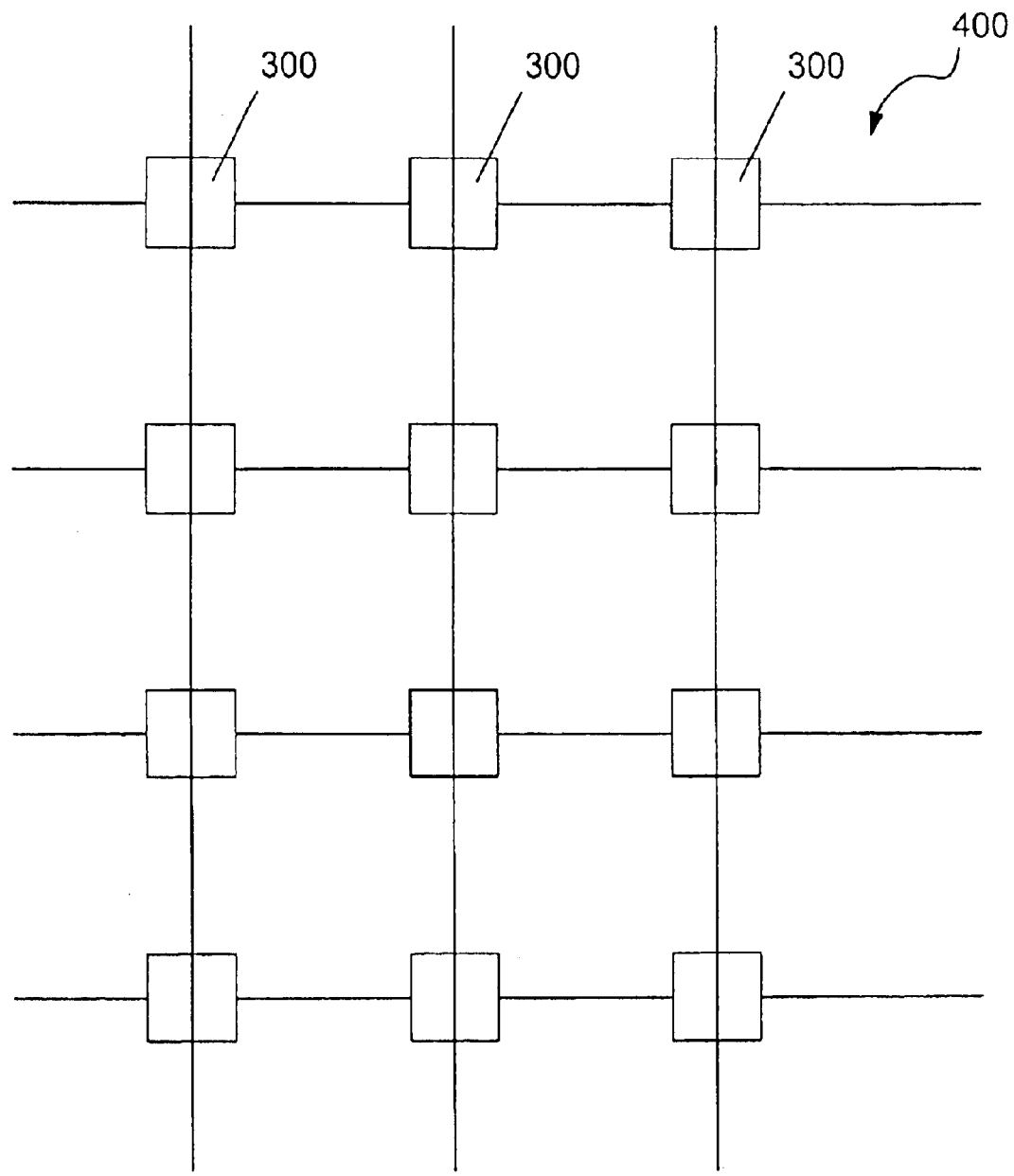
FIG. 4 shows an array of memory cells according to an embodiment of the invention.

FIG. 4 shows an array of memory cells according to an embodiment of the invention. That is, a memory cell array 400 can be formed from a plurality of MRAM/DRAM memory cells 300 of FIG. 3. As will be described later, an array of the MRAM/DRAM memory cells can be used to easily transfer large amounts of data between the MRAM and DRAM memory cells.

Many applications exist that can utilize the advantages of the memory cell array 400. The memory cell array 400 can offer the advantages of both volatile and non-volatile memory. The volatile memory can offer fast access, while the non-volatile memory can provide memory back up of the volatile memory.

Figure 5:
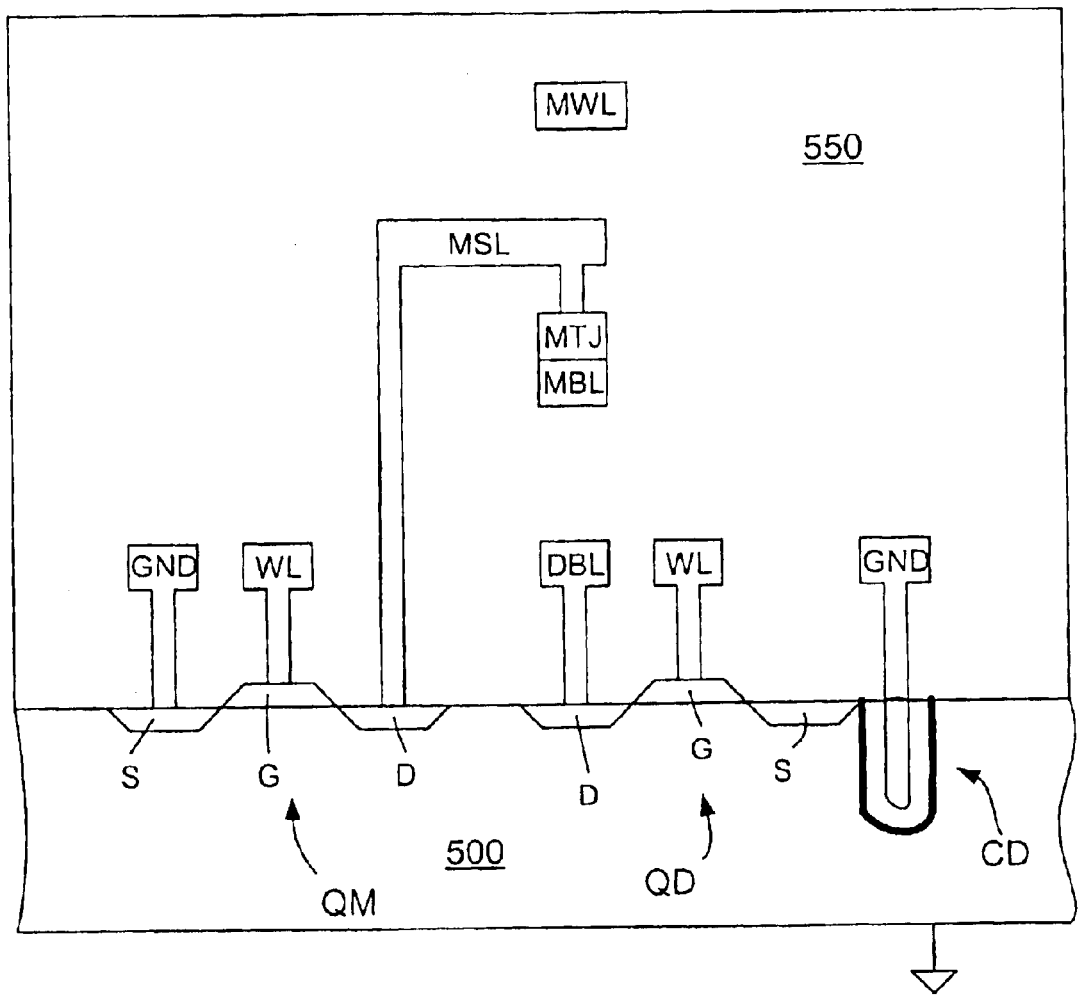
FIG. 5 shows a shared memory cell according to another embodiment of the invention.

FIG. 5 shows a shared memory cell according to another embodiment of the invention. FIG. 5 is an embodiment of a physical implementation of the MRAM/DRAM memory cell 300 of FIG. 3.

This embodiment can be fabricated on a substrate 500 of silicon. Diffusion regions in the substrate 500 can be used to form the drain (D) and source (S) of the MRAM controlling transistor QM and the DRAM controlling transistor QD.

A trench formed in the substrate 500 can be filled with conductive material and dielectric material to form the DRAM capacitor CD.

A first metallization layer can be used to form conductive contacts to the source (S) of the MRAM controlling transistor, the gate (G) of the MRAM controlling transistor, the drain (D) of the DRAM controlling transistor (D), the gate (G) of the DRAM controlling transistor and the DRAM capacitor. The source of the MRAM controlling transistor can be connected to ground (GND). The gate (G) of the MRAM controlling transistor can be connected to the word line (WL). The drain (D) of the DRAM controlling transistor can be connected to the DRAM bit line DBL. The source (S) of the DRAM controlling transistor is connected to a first terminal of the DRAM capacitor CD. This connection can be formed by forming the source (S) of the DRAM controlling transistor so close to the first terminal of the DRAM capacitor CD that source (S) and the first terminal are electrically connected. A second terminal of the DRAM capacitor CD can be connected to ground (GND).

A second metallization layer can be used to form a conductive contact to the magnetic tunnel junction (MTJ) memory cell of the MRAM memory cell. The conductive contact can be connected to the MRAM bit line MBL.

A third metallization layer can also be used to form a conductive contact to the magnetic tunnel junction device of the MRAM memory cell. The conductive contact can be connected to the MRAM sense line MSL.

A fourth metallization layer can be used to form the MRAM write word line MWL.

The metallization layers can be formed from Tantalum, Copper or Aluminum.

FIGS. 6A, 6B, 6C, 6D, 6E show a process that can be used for forming the embodiment of FIG. 5. Several processing steps are required to form each of the structures shown in FIGS. 6A, 6B, 6C, 6D, 6E. Only a subset of the complete set of processing steps required to form the embodiment have been included in this description.

Figure 6A:
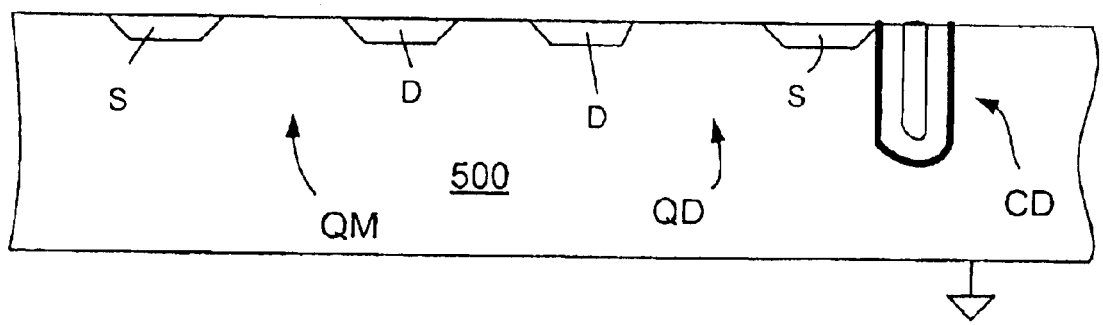
FIGS. 6A, 6B, 6C, 6D, 6E show a process for forming the embodiment of FIG. 5.

FIG. 6A shows a first set of processing steps. This set of processing steps includes forming diffusion regions in the substrate 500. The diffusion regions form the sources (S) and drains (D) of the DRAM controlling transistor and the MRAM controlling transistor.

A trench is formed in the substrate. The trench can be formed by a reactive ion etching process. A first metallic layer is deposited in the trench. A dielectric is then deposited in the trench. Finally, a second metallic layer or a poly-silicon is deposited over the dielectric forming the DRAM capacitor CD. The source (S) of the DRAM controlling transistor and the first metallic layer of the DRAM capacitor CD can be formed close enough that they are in electrical contact with each other. The formation of trench capacitors is well known in the art of semiconductor processing.

Figure 6B:
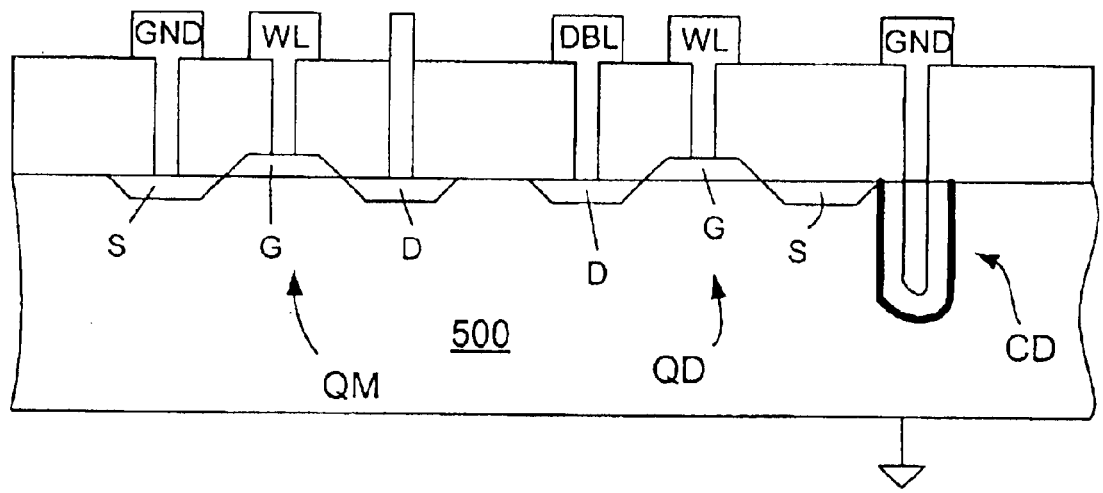

FIG. 6B shows a second set of processing steps. This set of processing steps includes forming the gates (G) of the MRAM controlling transistor and the DRAM controlling transistor. The gates (G) can be formed by patterning a gate oxide, and then depositing and patterning a poly-silicon to complete the formation of the gates (G).

A dielectric can then be deposited. The dielectric is then etch according to a pattern to allow for creation of a set of vias. The vias are then created by depositing a conductive material into the patterned etched holes. The conductive material can be Tantalum Nitride.

The dielectric and the vias are then typically chemically-mechanically polished to planarize the dielectric and the vias before depositing the previously described first metallization layer. The first metalization layer is then deposited and patterned to form conductive contacts to the source (S) of the MRAM controlling transistor, the gate (G) of the MRAM controlling transistor, the drain (D) of the DRAM controlling transistor (D), the gate (G) of the DRAM controlling transistor and the DRAM capacitor. A via is also formed that is connected to the drain (D) of the MRAM controlling transistor QM, and eventually leads to a connection to the MRAM sense line MSL.

Figure 6C:
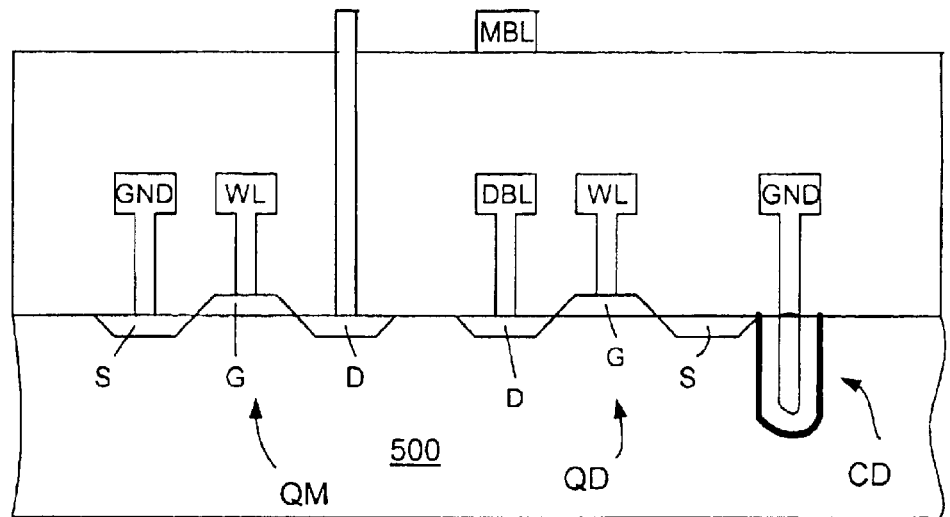

FIG. 6C shows a third set of processing steps. This set of processing steps includes depositing another dielectric layer. The dielectric layer then etch according to a pattern to continue the formation of the MRAM sense line (MSL) connection. The dielectric is typically then chemically-mechanically polished to planarize the dielectric and the via before depositing the previously described second metallization layer.

The second metallization layer is then deposited and patterned to form a conductive contact to the magnetic tunnel junction (MTJ) memory cell of the MRAM memory cell. The conductive contact can be connected to the MRAM bit line MBL.

Figure 6D:
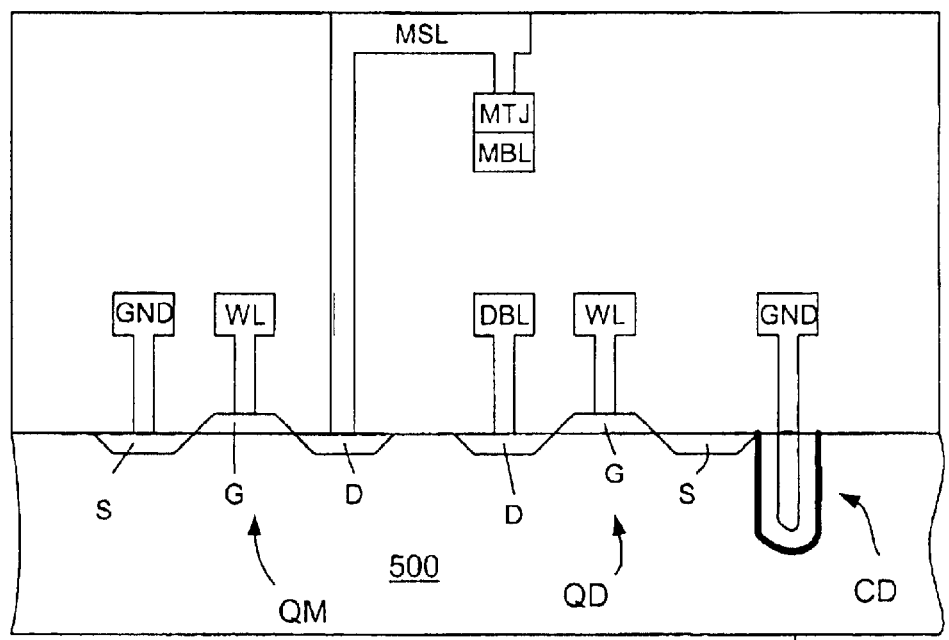

FIG. 6D shows a third set of processing steps. This set of processing steps includes forming the magnetic tunnel junction (MTJ) memory cell over the MRAM bit line MBL. The formation of the magnetic tunnel junction (MTJ) memory cell includes formation of the previously described sense layer, reference layer and insulating tunnel barrier.

The insulating tunnel barrier 324 can be made of aluminum oxide, silicon dioxide, tantalum oxide, silicon nitride, aluminum nitride, or magnesium oxide. However, other dielectrics and certain semiconductor materials may also be used for the insulating tunnel barrier 324. The thickness of the insulating tunnel barrier 324 may range from about 0.5 nanometers to about three nanometers. However, the invention is not limited to this range.

The sense layer 322 may be made of a ferromagnetic material. The reference layer 326 can be implemented as a synthetic ferrimagnet (SF), also referred to as an artificial antiferromagnet.

Another dielectric layer can then be deposited over the MTJ memory cell and the second metallization layer. This dielectric layer is then etched according to a pattern to allow continuation of the MSL via, and to allow creation of a via to the MTJ memory cell. The vias are then formed by depositing a conductive material in holes created by the etching. The vias and the dielectric layer are then typically chemically-mechanically polished before deposition of the previously described third metallization layer.

The third metallization layer is then deposited to form a conductive contact to the MTJ memory cell of the MRAM memory cell, and the drain (D) of the MRAM controlling transistor QM.

Figure 6E:
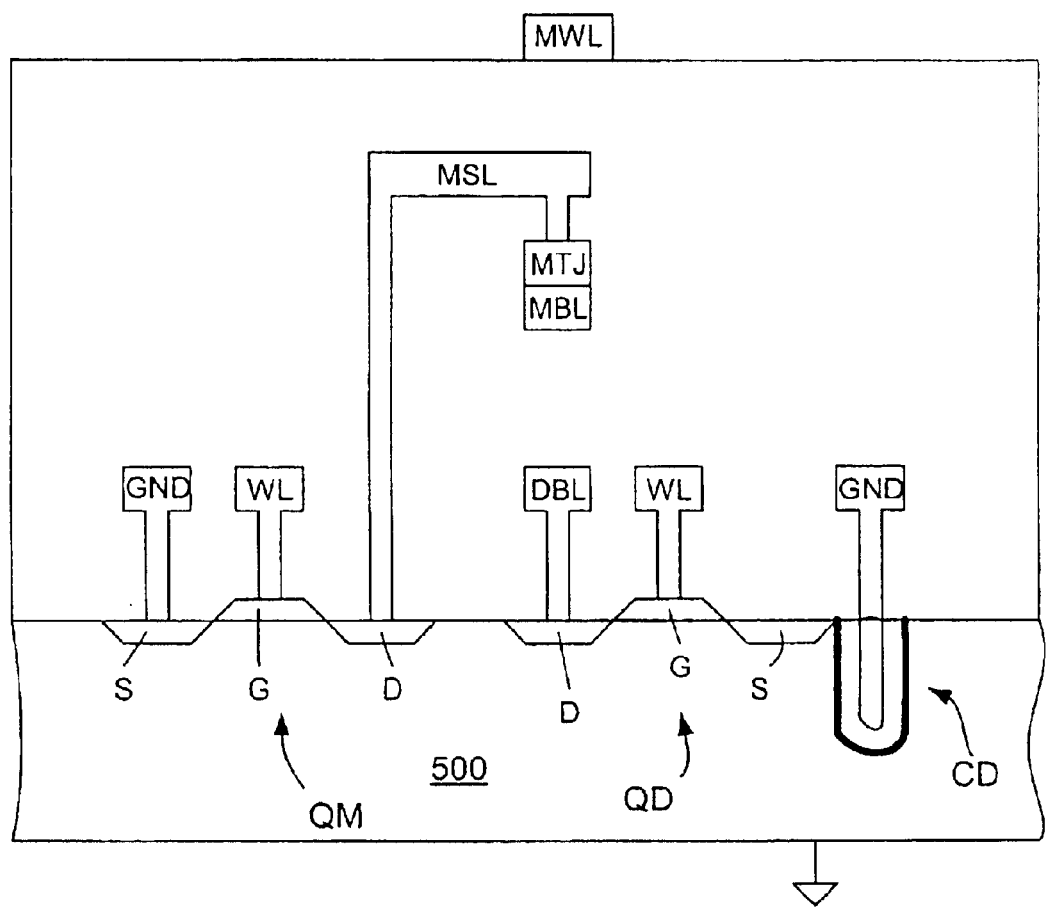

FIG. 6E shows a fourth set of processing steps. This set of processing steps includes depositing another dielectric layer. This dielectric layer can then be chemically-mechanically polished before deposition of the previously described fourth metallization layer.

The fourth metallization layer can then be deposited and patterned to form the MRAM word line MWL. The MRAM word line MWL must be formed in the vicinity of the MTJ memory cell to allow current flowing through the MRAM word line MWL is set magnetic field orientations within the MTJ memory cell.

Figure 7:
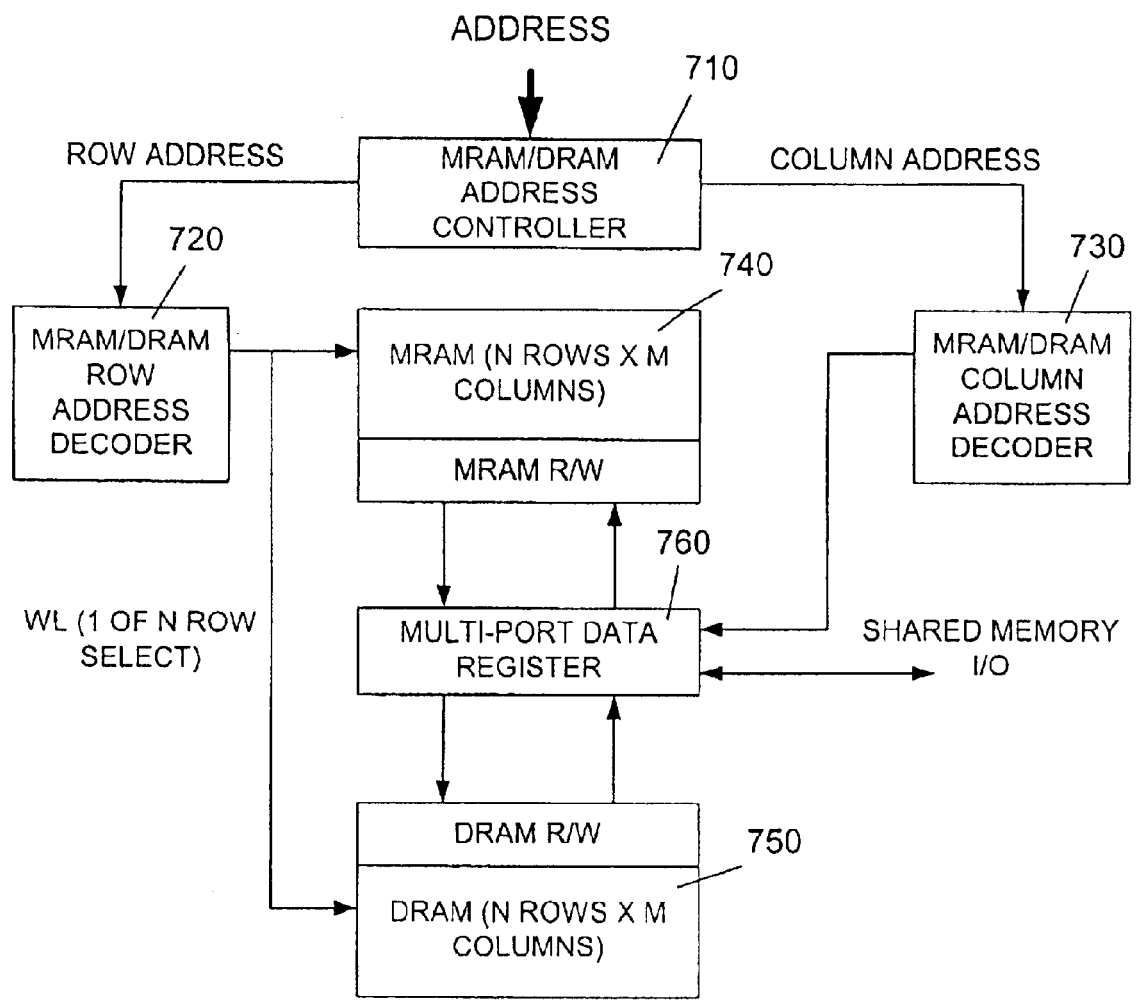
FIG. 7 shows a shared memory system according to an embodiment of the invention.

FIG. 7 shows a shared memory system according to an embodiment of the invention. This system allows large amounts of data to be transferred from DRAM to MRAM, and from MRAM to DRAM, in a single operation. The number of data lines between the DRAM memory cells and the MRAM memory cells can greater than 1024.

An MRAM/DRAM address controller 710 receives a memory address to be accessed from a central processing unit (CPU) or some other type of controller. As with a standard address controller, the MRAM/DRAM address controller 710 generates a row address and a column address. The row address and the column address select one of N rows within either the DRAM or the MRAM, and one of M columns within the DRAM or the MRAM.

The row address is received by an MRAM/DRAM row address decoder 720. The MRAM/DRAM row address decoder 720 effectively generates a word line (WL) selection. The selected word line WL selects one of the N rows of memory of the MRAM and the DRAM.

The column address is received by an MRAM/DRAM column address decoder 730. The MRAM/DRAM column address decoder 730 effectively generates a word line (BL) selection. The selected bit line BL selects one of the M columns of memory of the MRAM and the DRAM.

An array of MRAM memory cells 740 includes N rows and M columns of MRAM memory cells. The array of MRAM memory cells 740 further includes standard MRAM read/write circuitry.

An array of DRAM memory cells 750 includes N rows and M columns of DRAM memory cells. The array of DRAM memory cells 750 further includes standard DRAM read/write circuitry.

A multi-port data register 760 includes wide data registers that are connected to the sense amplifiers and columns of both the array of MRAM memory cells 740 and the array of DRAM memory cells 750. The multi-port data register 760 includes a shared memory I/O which provides the data input and output to the shared arrays of MRAM and DRAM memory. The multi-port data register 760 receives the selected bit line BL from the MRAM/DRAM column address decoder 730. External control lines (not shown) determine whether the registers within the multi-port data register 760 are transferring data to or from the memory cells of the DRAM and/or the MRAM. Multi-port data registers are well known in the art of digital electronics.

Operation of the external control lines, along with the address selection received by the MRAM/DRAM address controller 710, determines which data is being written or read from either the DRAM or the MRAM. The inclusion of the wide data line multi-port data register 760 that is connected to a large number of both DRAM memory cells and MRAM memory cells allows a large amount of data to be transferred from either the DRAM memory cells to the MRAM memory cells, or from the MRAM memory cells to the DRAM memory cells is a single operation.

Figure 8:
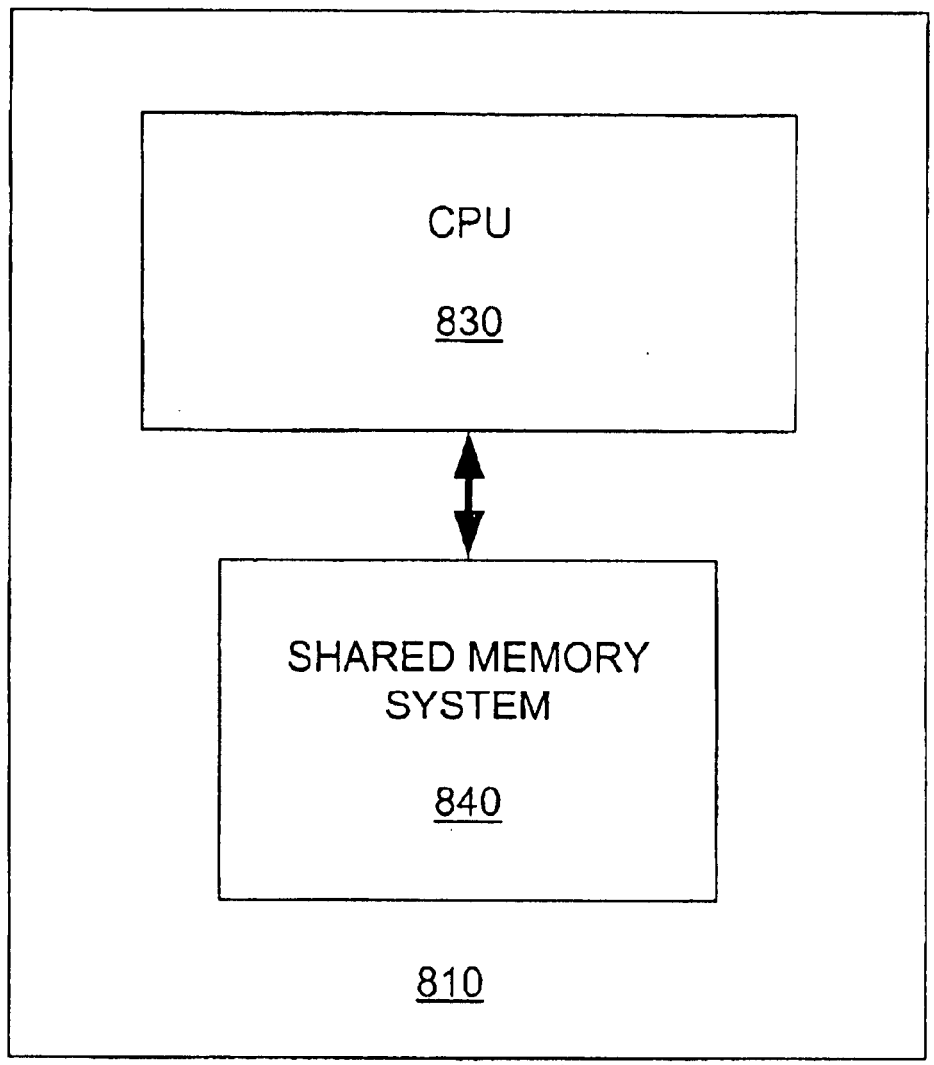
FIG. 8 shows a computing unit that includes a CPU and a shared memory system according to an embodiment of the invention.

Many different applications exist for the share memory system of FIG. 7. For example, FIG. 8 shows a computing unit 810 that includes a CPU 830 and a shared memory system 840 according to an embodiment of the invention.

The computing unit 810 can be, for example, a laptop computer. The DRAM memory can be used during normal operation of the laptop, providing fast memory accesses. Sectors of the DRAM can be backed up with the MRAM during periods of time in which the sectors of the DRAM are not being accessed.

If the laptop computer is powered down or put in standby mode, the DRAM is no longer refreshed, and the DRAM loses its data. Through operation of the shared memory system 840, thehe MRAM back up memory can be used to restore the back up data in the DRAM in a single operation.

Figure 9:
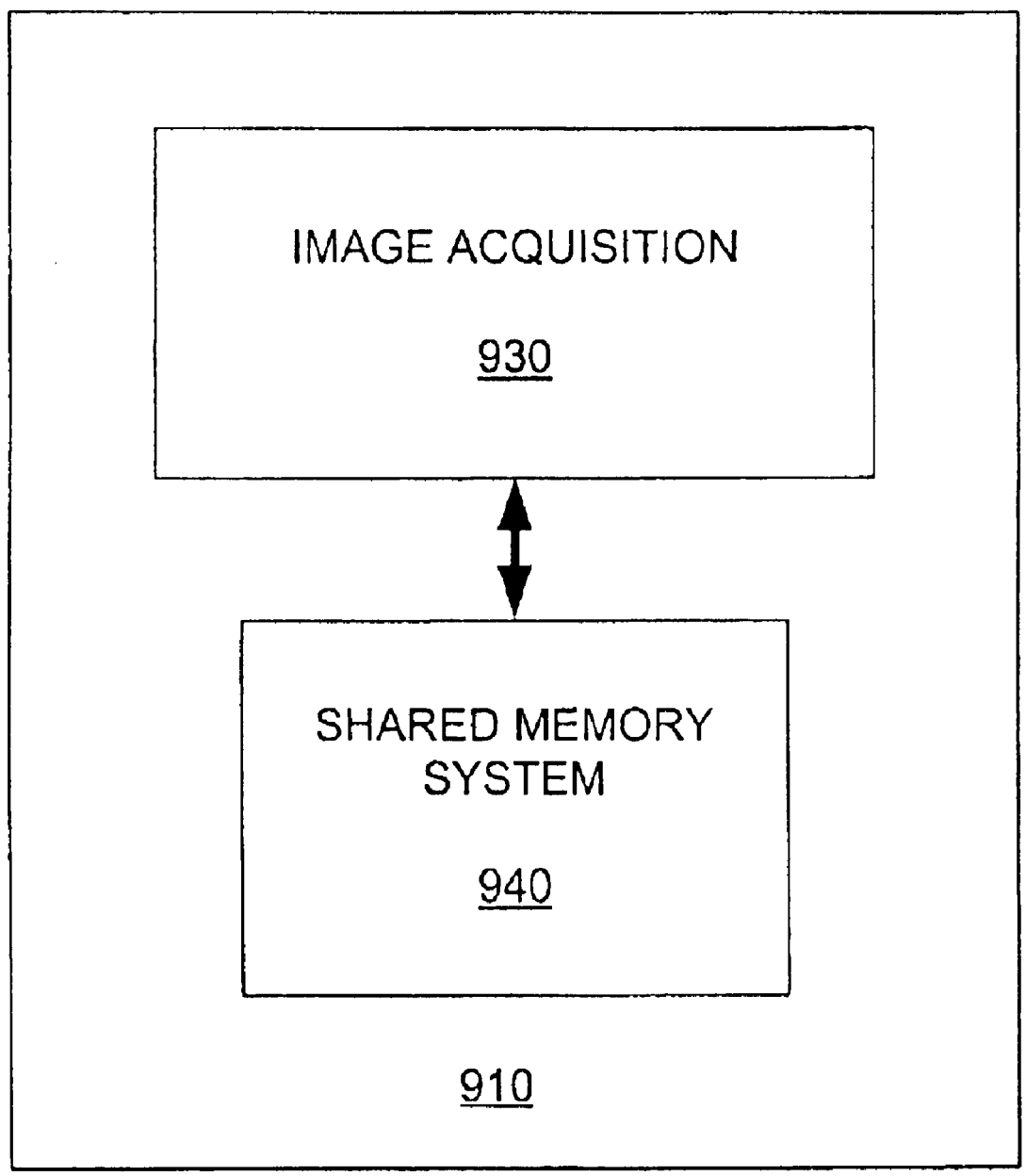
FIG. 9 shows an imaging system according to an embodiment of the invention.

In some situations, the MRAM memory cells can include faster write operations than the DRAM memory cells. FIG. 9 shows an imaging system 910 in which graphics buffer or camera storage device utilizes the fast write operation of the MRAM memory cells to store images. The fast read capabilities of the DRAM may be used for fast reading of the data. The imaging system 910 generally includes a CPU 930 that controls operation of a shared memory system 940

Although specific embodiments of the invention have been described and illustrated, the invention is not to be limited to the specific forms or arrangements of parts so described and illustrated. The invention is limited only by the appended claims.

What is claimed:

1. A memory back-up system comprising:
   a volatile memory cell;
   a non-volatile memory cell, the non-volatile memory cell being integrated with the volatile memory cell, the non-volatile memory cell being interfaced with the volatile memory cell;
   a single word line WL connected to the integrated volatile memory cell and the non-volatile memory cell, the single word line WL allowing data to be simultaneously written to the volatile memory cell and the non-volatile memory cell.

2. The memory back-up system of claim 1, wherein the volatile memory cell is a DRAM memory cell and the non-volatile memory cell is an MRAM memory cell.

3. The memory back-up system of claim 1, further comprising a second control line which in combination with the single word line WL provides selection of the volatile memory cell.

4. The memory back-up system of claim 1, further comprising a third control line which in combination with the single word line WL provides selection of the non-volatile memory cell.

5. The memory back-up system of claim 1, further comprising a
   an array volatile memory cells;
   an array of non-volatile memory cells, each non-volatile memory cell interfaced with a corresponding volatile memory cell;
   a plurality of word lines WL, each single word line WL connected to a corresponding plurality of volatile memory cells and the non-volatile memory cells, the word line WL allowing data to be simultaneously written to the corresponding plurality of volatile memory cells and the non-volatile memory cells.

6. A memory back-up system comprising:
   a plurality of first memory cells;
   a plurality of non-volatile memory cells that are interfaced to the first memory cells;
   control circuitry that allows data to be written to one of the first memory cells and the non-volatile memory cells, and that provides transfer of the data from one of the first memory cells and the non-volatile memory cells to the other one of the first memory cells and the non-volatile memory cells.

7. The memory back-up system of claim 6, wherein the control circuitry further includes allowing data to be read from one of the first memory cell and the non-volatile memory cell.

8. A computing device comprising:

a controller;

a memory unit interfaced with the controller, the memory unit comprising;

an array volatile memory cells;

an array of non-volatile memory cells, each non-volatile memory cell integrated and interfaced with a corresponding volatile memory cell; and a plurality of word lines WL, each word line WL connected to a corresponding plurality of the integrated volatile memory cells and the non-volatile memory cells, the word line WL allowing data to be simultaneously written to the corresponding plurality of volatile memory cells and the non-volatile memory cells.

9. An image storing device comprising:

means for receiving an image;

a memory unit for storing the image, the memory unit comprising;

an array volatile memory cells;

an array of non-volatile memory cells, each non-volatile memory cell integrated and interfaced with a corresponding volatile memory cell; and a plurality of word lines WL, each word line WL connected to a corresponding plurality of the integrated volatile memory cells and the non-volatile memory cells, the word line WL allowing data to be simultaneously written to the corresponding plurality of volatile memory cells and the non-volatile memory cells.

10. The memory back-up system of claim 9, further comprising a plurality word lines, wherein a single word line WL is connected to both a first memory cell and a non-volatile memory cell.

11. The memory back-up system of claim 10, wherein the single word line WL is connected to a DRAM controlling transistor gate of the DRAM memory cell and a to a MRAM controlling transistor gate of the MRAM memory cell.

12. A memory back-up system comprising:

a volatile memory cell;

a non-volatile memory cell that is interfaced with the volatile memory cell;

a single word line WL connected to the volatile memory cell and the non-volatile memory cell, the single word line WL allowing data to be simultaneously written to the volatile memory cell and the non-volatile memory cell; wherein the volatile memory cell is a DRAM memory cell and the non-volatile memory cell is an MRAM memory cell.

* * * * *